United States Patent [19]

Nakamura

[11] Patent Number: 5,532,501
[45] Date of Patent: Jul. 2, 1996

[54] SEMICONDUCTOR DEVICE HAVING WIRING TAKE-OUT CELLS

[75] Inventor: Takeshi Nakamura, Tokyo, Japan

[73] Assignee: NEC Corporation, Japan

[21] Appl. No.: 247,541

[22] Filed: May 23, 1994

[30] Foreign Application Priority Data

May 25, 1993 [JP] Japan ................................. 5-122237

[51] Int. Cl.[6] .......................... H01L 27/10; H01L 23/58
[52] U.S. Cl. ...................... 257/208; 257/202; 257/207; 257/923
[58] Field of Search .................................. 257/204, 207, 257/368, 385, 396, 923, 206, 202, 579, 477, 211, 208

[56] References Cited

FOREIGN PATENT DOCUMENTS 61-114550   6/1986   Japan .

*Primary Examiner*—Sara W. Crane
*Assistant Examiner*—Carl Whitehead, Jr.

[57] ABSTRACT

In a semiconductor device having a plurality of logic cell areas and a plurality of wiring channel areas therebetween, a wiring take-out cell for taking out wiring to the wiring channel areas is provided between specific logic cells which cannot be directly connected by the batting method.

8 Claims, 12 Drawing Sheets

X = VIRTUAL TERMINAL
O = THROUGH HOLE

□ = NODE

SEMICONDUCTOR DEVICE HAVING WIRING TAKE-OUT CELLS

BACKGROUND OF THE INVENTION

1. Field of the Invention

The present invention relates to a semiconductor device such as a base cell (standard cell)-type semi-custom logic semiconductor device.

2. Description of the Related Art

A typical standard cell-type logic semiconductor device includes a plurality of standard cell (logic cell) areas, and a plurality of wiring channel areas therebetween. Within each of the logic cell areas, the widths of logic cells can be different from each other in accordance with the functions thereof, while the heights of the logic cells are the same and definite. Therefore, virtual terminals (which are defined by a computer-aided design (CAD)) of the two adjacent logic cells within each of the logic cell areas are directly connected by a so-called batting method, which is one of the features of the standard cells. Hereinafter, note that virtual terminals are simply referred to as "terminals". On the other hand, the wiring channel areas for connecting the logic cells belonging to the two adjacent logic cell areas to each other are variable, and therefore, an automatic wiring method using a channel router is carried out to enhance the integration of the device.

In the above-mentioned logic cell areas, if opposing edges of two adjacent logic cells do not have the same type terminal arrangement, the two adjacent logic cells cannot be directly connected to each other by the batting method. In this case, even if the two logic cells are separated by a space or a non-logic cell, each of the two logic cells may have terminals which cannot be automatically connected by the channel router, since the channel router provides wiring only along one direction. This will be explained later in detail.

There are three prior art methods for performing a wiring operation upon the terminals of the specific logic cells which cannot be connected by the channel router.

A first wiring method is carried out manually by using an interactive CRT on which the terminals of the specific logic cells are splayed. In the first wiring method, however, the efficiency of design is decreased, thus increasing the manufacturing cost of the device.

In a second wiring method, logic cell areas having specific logic cells are divided into two rows, so that one specific logic cell belongs to one row and the other specific logic cell belongs to the other row. In the second wiring method however, the device is enlarged, thus reducing the integration of the device. This will be explained later in detail.

In a third wiring method, a wiring cell is provided between the two specific logic cells (see: JP-A-61-114550). Even in the third wiring method, all of the terminals of the specific logic cells are not always connected to each other, this will be explained later in detail.

SUMMARY OF THE INVENTION

It is an object of the present invention to provide a semiconductor device having logic cell areas and wiring channel areas, in which a wiring operation can be automatically performed upon specific logic cells which cannot be directly connected by the batting method.

According to the present invention, in a semiconductor device having a plurality of logic cell areas and a plurality of wiring channel areas therebetween, a wiring take-out cell for taking out wiring to the wiring channel areas is provided between specific logic cells which cannot be directly connected by the batting method.

BRIEF DESCRIPTION OF THE DRAWINGS

The present invention will be more clearly understood from the description as set forth below, as compared with the prior art, with reference the accompanying drawings, wherein.

DESCRIPTION OF THE PREFERRED EMBODIMENTS

Before the description of the preferred embodiments, prior art semiconductor devices will be explained with reference to FIGS. 1 to 4.

Figure 1:
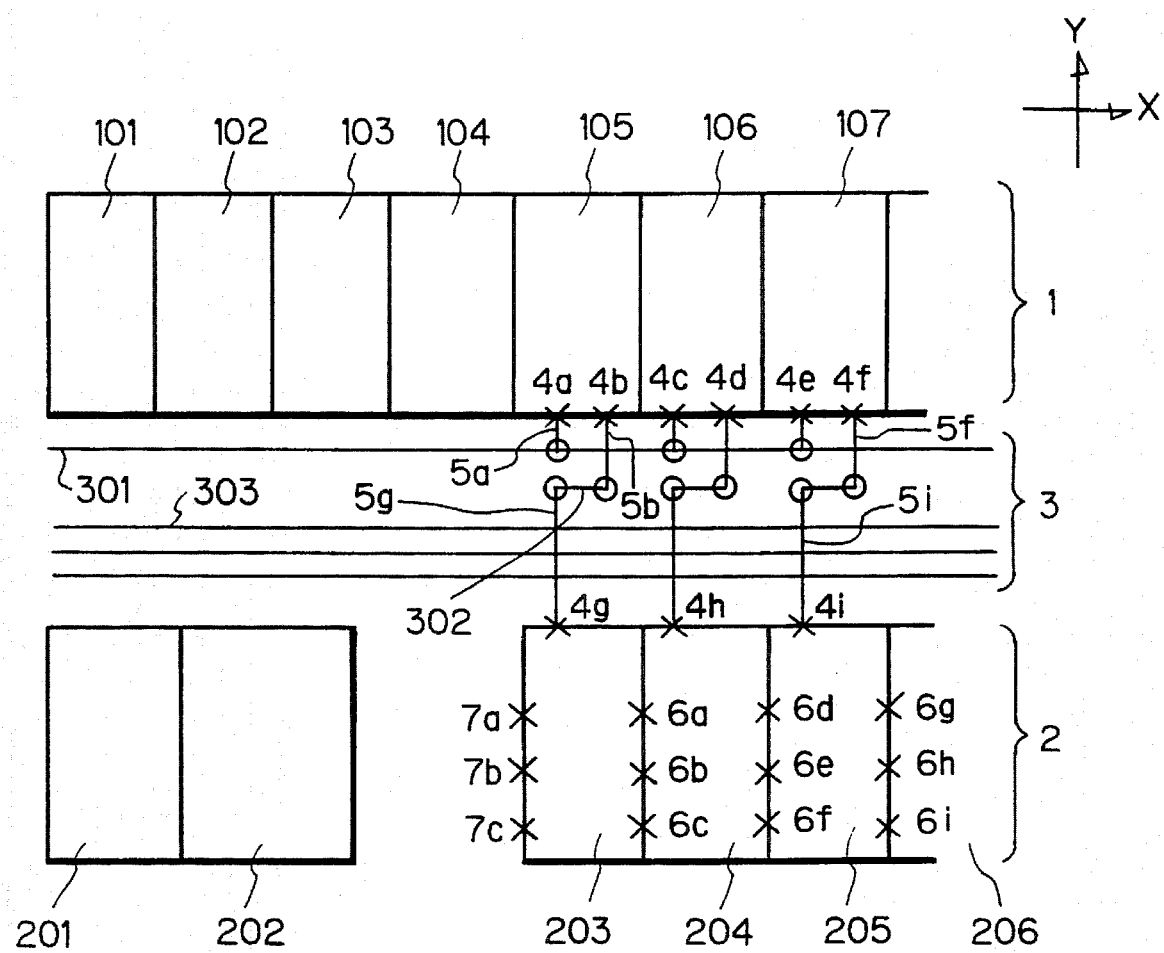
FIG. 1 is a layout diagram illustrating a first prior art standard cell-type semiconductor device.

In FIG. 1, which is a layout diagram illustrating a first prior art standard cell-type semiconductor device, reference numerals 1 and 2 designate logic cell areas having a wiring channel area 3 therebetween. The logic cell area 1 includes a plurality of logic cells 101, 102, . . . in a row along an X-direction which have the same height, but have different widths. Similarly, the logic cell area 2 includes logic cells 201, 202, . . . in a row along the X-direction which have the same height, but have different widths. In this case, the logic cells 202 and 203 are specific logic cells which cannot be directly connected by the batting method, and therefore, the logic cells 202 and 203 are separated by a space or a non-logic cell.

The wiring channel area 3 includes wiring 301, 302, . . . along the X-direction which are made of a first aluminum layer.

Terminals, for example, 4a, 4b, . . . , 4i of the logic cells 105, 106, 107, 203, 204 and 205 face the wiring channel area 3. Therefore, since the channel router provides wiring made of a second aluminium layer along only one direction which is, in this case, along the Y-direction, the terminals 4a through 4i can be automatically connected by the channel router. For example, the terminals 4a, 4c and 4e are connected by wiring 5a, 5c and 5e along the Y-direction via through holes to the wiring 301. The terminal 4b of the logic cell 105 is connected by a wiring 5b along the Y-direction via a through hole to the wiring 302 and also, is connected via a through hole by a wiring 5g along the Y-direction to the terminal 4g of the logic cell 203.

The right side edge of the logic cell 203 is the same type as the left side edge of the logic cell 204. Therefore, the right side edge of the logic cell 203 and the left side edge of the logic cell 204 have common terminals 6a, 6b and 6c, i.e., the terminals at the right side edge of the logic cell 203 are directly connected to those at the left side edge of the logic cell 204 by the batting method. Similarly, the right side edge of the logic cell 204 is the same type as the left side edge of the logic cell 205. Therefore, the right side edge of the logic cell 204 and the left side edge of the logic cell 205 have common terminals 6d, 6e and 6f, i.e., the terminals at the right side edge of the logic cell 204 are directly connected to those at the left side edge of the logic cell 205 by the batting method. Also, the right side edge of the logic cell 205 is the same type as the left side edge of the logic cell 206. Therefore, the right side edge of the logic cell 205 and the left side edge of the logic cell 26 have common terminals 6g, 6h and 6i, i.e., the terminals at the right side edge of the logic cell 205 are directly connected to those at the left side edge of the logic cell 206 by the batting method.

As explained above, the logic cells 202 and 203 are specific logic cells which cannot be directly connected by the batting method. That is, the left-side edge of the logic cell 203 has terminals 7a, 7b and 7c, while the right-side of the logic cell 202 has no terminals. Hereinafter, the left side edge of the logic cell 203 is referred to as an edge type α, and the right side edge of the logic cell 202 is referred to as an edge type β. In this case, since the channel router provides only Y-direction wiring, the terminals 7a, 7b and 7c of the logic cell 203 cannot be connected to any terminals by using the channel router.

Note that, when a block router is used as an automatic wiring method, it is impossible to define the position of the logic cell areas, so that the wiring channel areas are redundant. Also, when a naze router is used as an automatic wiring method, there is a restriction in the arrangement of the logic cells, so that it is impossible to define the position of the wiring channel areas. Thus, such automatic wiring methods are disadvantageous with respect to the integration of the device as compared with the channel router.

Figure 2:
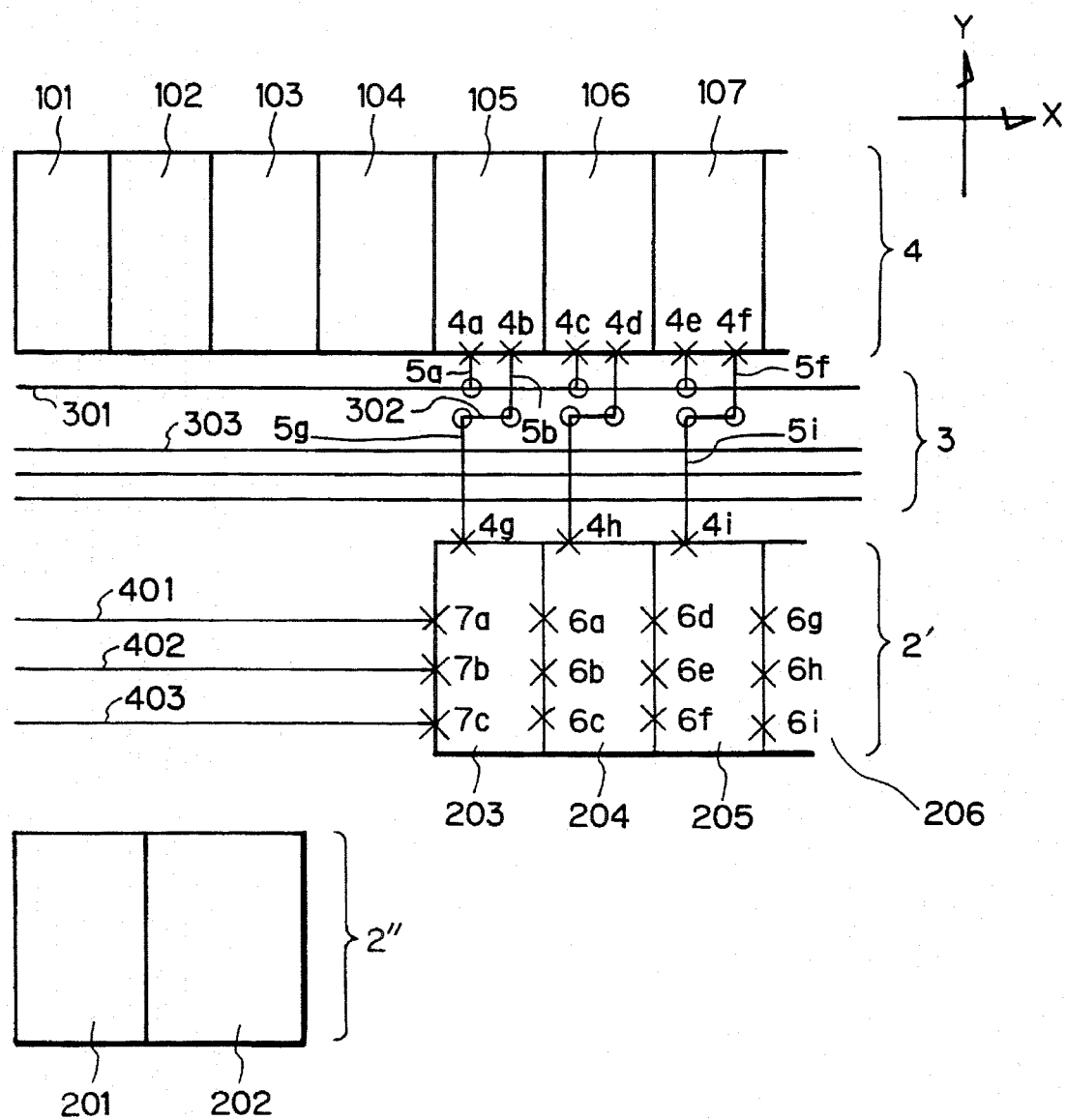
FIG. 2 is a layout diagram illustrating a second prior art standard cell-type semiconductor device.

In FIG. 2, which is a layout diagram illustrating a second prior art standard cell-type semiconductor device, the logic cells 201 and 202 of the logic cell area 2 of FIG. 1 are shifted. In other words, the logic cell area 2 of FIG. 1 is divided into a logic cell area 2' formed by the logic cells 203, 204, 205, . . . and a logic cell area 2" formed by the logic cells 201 and 202. Therefore, the terminals 7a, 7b and 7c at the left side edge of the logic cell 203 are not covered by the logic cell 202. As a result, if wiring 401, 402 and 403 made of the first aluminium layer can be connected to the terminals 7a, 7b and 7c of the logic cell 203, a wiring operation can be automatically performed upon the terminals 7a, 7b and 7c of the logic cell 203. In FIG. 2, however, the device is enlarged, thus reducing the integration of the device.

Figure 3:
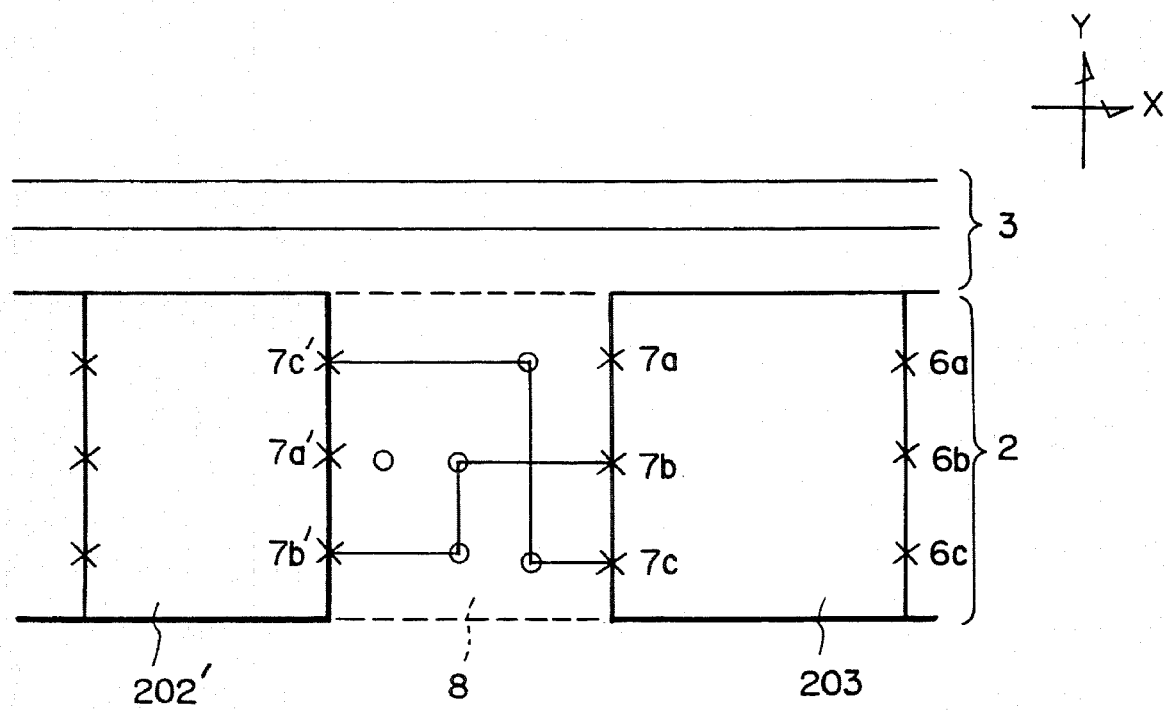
FIG. 3 is a layout diagram illustrating a third prior art standard cell-type semiconductor device.

In FIG. 3, which is a layout diagram illustrating a third prior art semiconductor device (see: JP-A-61-114550), a logic dell 202' of the logic cell area 2 has terminals 7c', 7a' and 7b' at the right side edge thereof, which should be Connected to the terminals 7a, 7b and 7c, respectively, of the logic cell 23 of the logic cell area 2. Hereinafter, the right side edge of the logic cell 202' is referred to as an edge type γ. In the logic cell area 2, a wiring cell 8 is provided between the logic cells 202' and 203, so as to connect the terminals 7a, 7b and 7c of the logic cell 203 to the terminals 7a', 7b' and 7c", respectively, of the logic cell 202'. Actually, however, since the height, i.e., the length in the Y-direction of the logic cells is definite, so that the number of tracks for wiring along the X-direction is definite, for example, 3, all of the terminals 7a, 7b and 7c of the logic cell 203 are not always connected to the terminals 7a', 7b' and 7c', respectively, of the logic cell 202', as illustrated in FIG. 3.

Figure 4:
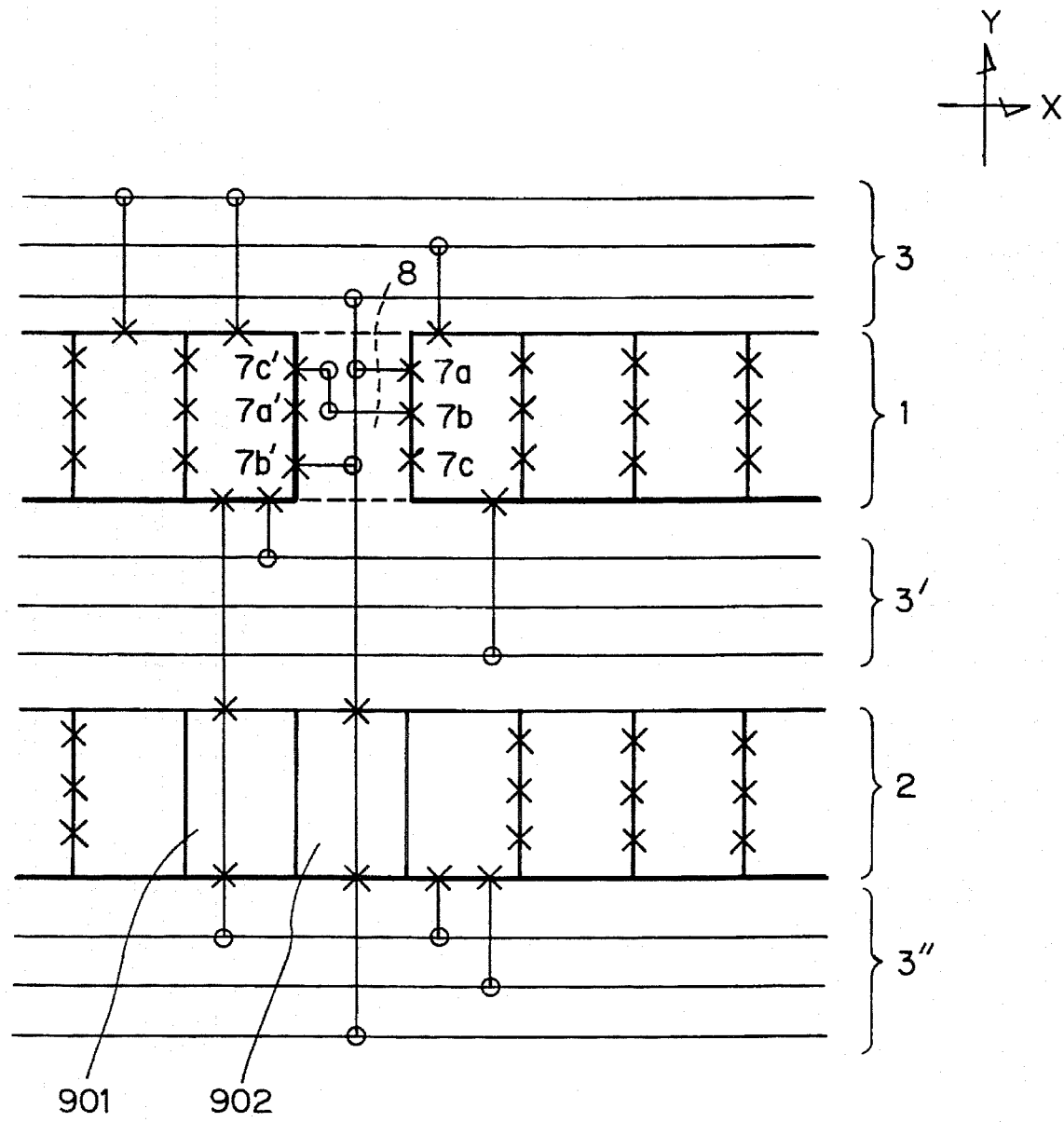
FIG. 4 is a layout diagram illustrating a fourth prior art standard cell-type semiconductor device.

In FIG. 4, which is a layout diagram illustrating a fourth prior art semiconductor device (also see: JP-A-61-114550), the logic cell area 1 includes the wiring cell 8 of FIG. 3 and the logic cell area 2 includes feed cells 901 and 902 which pass therethrough wiring along the Y-direction. Even in the wiring cell 8 of FIG. 4, all of the terminals 7a, 7b and 7c of the edge type α are not always connected to the 7a', 7b' and 7c', respectively, of the edge type γ.

Figure 5:
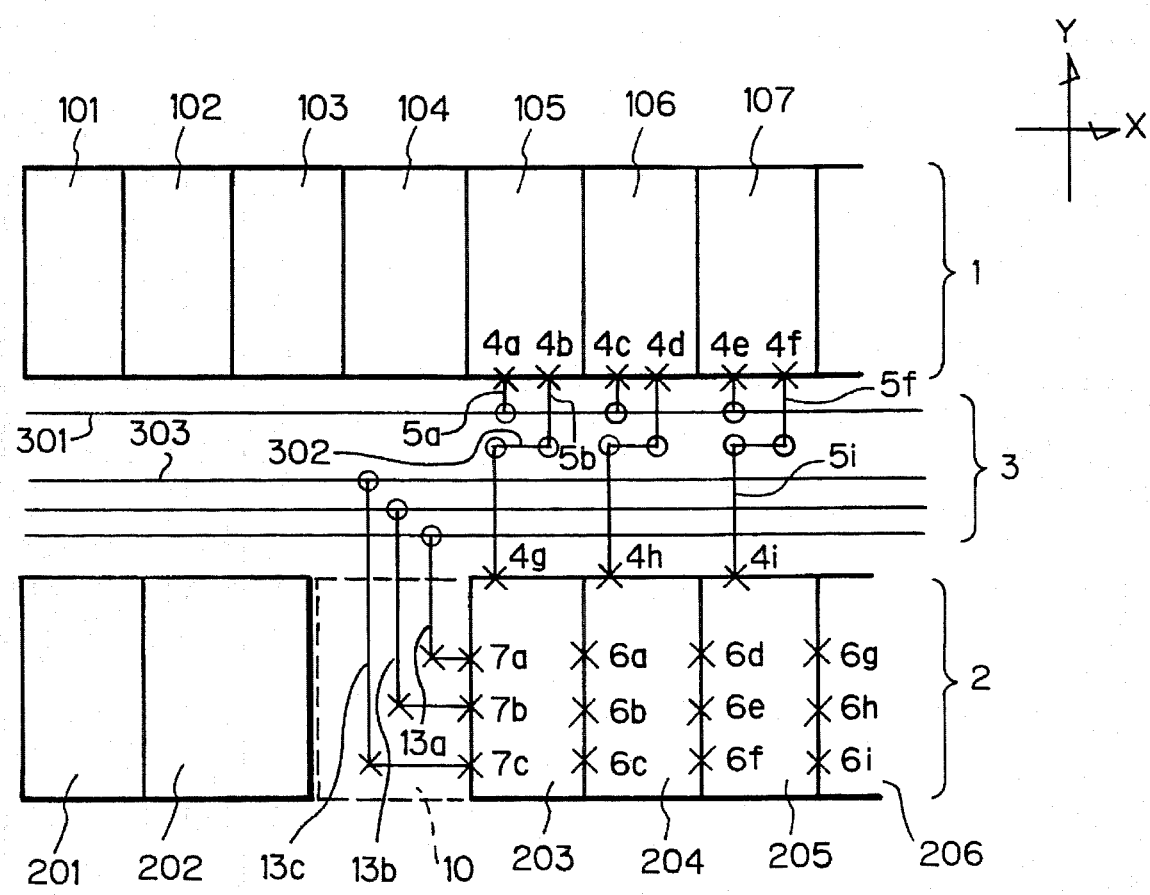
FIG. 5 is a layout diagram illustrating a first embodiment of the semiconductor device according to the present invention.
Figure 6A:
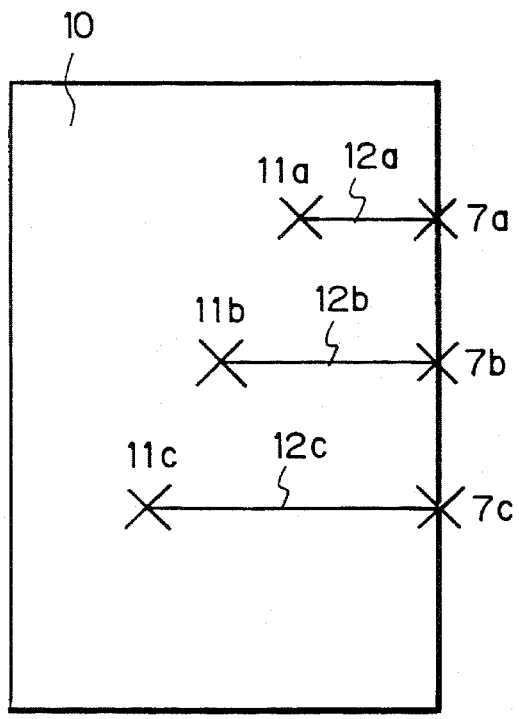
FIGS. 6A and 6B are enlarged layout diagrams of the wiring take-out cell of FIG. 5.

In FIG. 5, which illustrates a first embodiment of the present invention, a wiring take-out cell 10 is inserted between the logic cells 202 and 203 of FIG. 1. That is, as illustrated in FIG. 6A, the wiring take-out cell 10 includes terminals 11a, 11b and 11c within the cell 10 and wiring 12a, 12b and 12c linked between the terminals 7a, 7b and 7c and the terminals 11a, 11b and 11c.

In FIG. 5, wiring 13a, 13b and 13c linked between the terminals 11a, 11b and 11c (see FIG. 6A) of the wiring take-out cell 10 are arranged along the Y-direction, and therefore, the wiring 13a, 13b and 13c can be connected via through holes to the wiring of the wiring channel area 3 by the channel router.

Figure 6B:
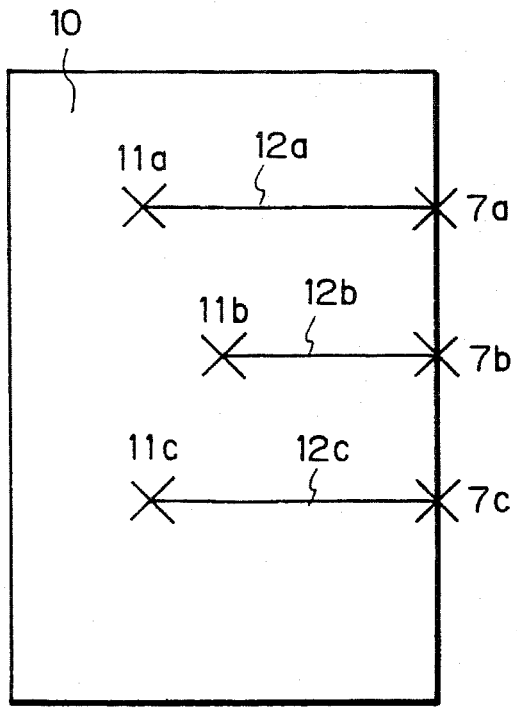

Note that the wiring take-out cell 10 can be modified into a cell as illustrated in FIG. 6B. In FIG. 6B, the terminals 11a and 11c are located at the same position along the X-direction. In this case, the terminal 11a can be connected to a wiring of only an upper side wiring channel area by the channel router, and the terminal 11c can be connected to a wiring of only a lower side wiring channel area by the channel router.

Figure 7:
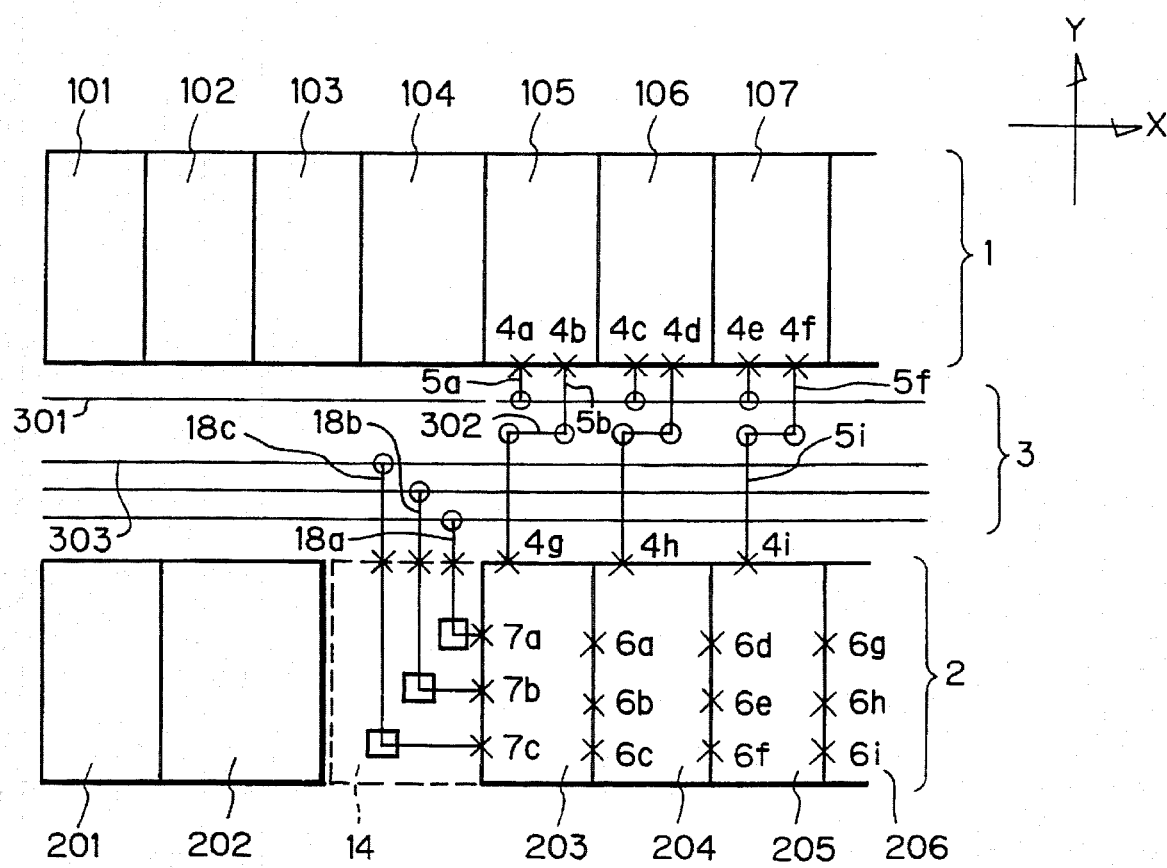
FIG. 7 is a layout diagram illustrating a second embodiment of the semiconductor device according to the present invention.
Figure 8A:
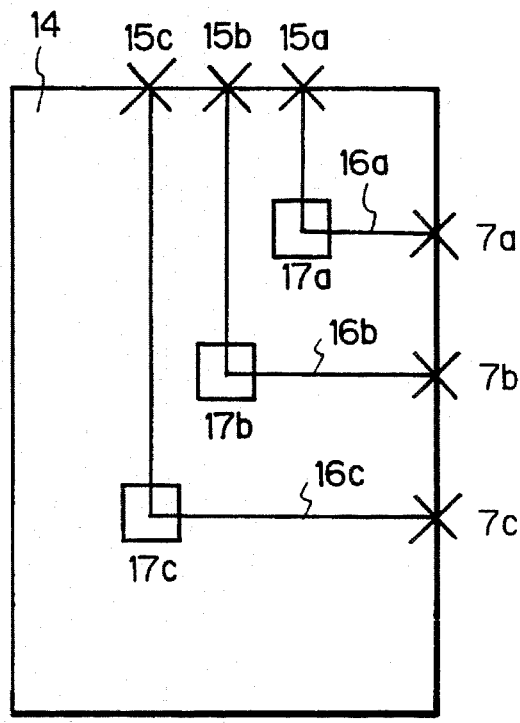
FIGS. 8A, 8B and 8C are enlarged layout diagrams of the wiring take-out cell of FIG. 7.

In FIG. 7, which illustrates a second embodiment of the present invention, a wiring take-out cell 14 is inserted between the logic cells 202 and 203 of FIG. 1. That is, as illustrated in FIG. 8A, the wiring take-out cell 14 includes terminals 15a, 15b and 15c at the boundary of the cell 14, wirings 16a, 16b and 16c linked between the terminals 7a, 7b and 7c and the terminals 15a, 15b and 15c, and nodes 17a, 17b and 17c for bending the wiring 16a, 16b and 16c, respectively.

In FIG. 7, wiring 18a, 18b and 18c linked between the terminals 15a, 15b and 15c (see FIG. 8A) of the wiring take-out cell 14 are arranged along the Y-direction, and therefore, the wiring 18a, 18b and 18c can be connected via through holes to the wiring of the wiring channel area 3 by the channel router.

Figure 8B:
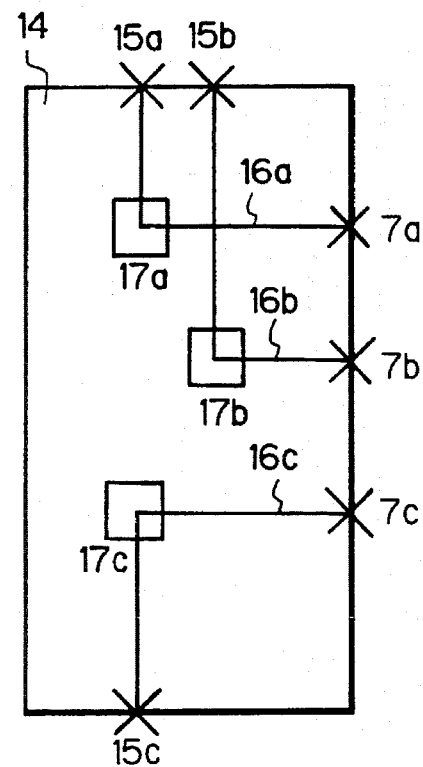
Figure 8C:
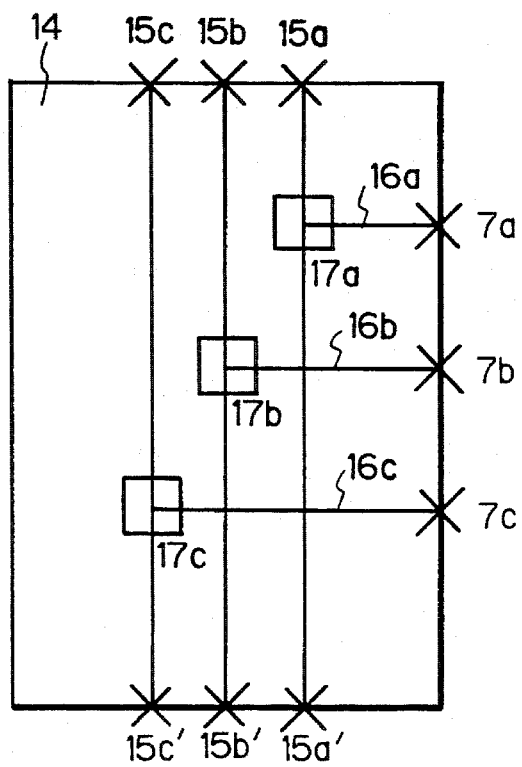

Note that the wiring take-out cell 14 can be modified into a cell as illustrated in FIG. 8B. In FIG. 8B, the terminals 15a and 15c are located at the same position along the X-direction. In this case, the terminal 15a can be connected to a wiring of only an upper side wiring channel area by the channel router, and the terminal 15c can be connected to a wiring of only a lower side wiring channel area by the channel router. Also, the wiring take out cell 14 can be modified into a cell as illustrated in FIG. 8C. In FIG. 8C, terminals 15a', 15b' and 15c' and wiring linked between the terminals 15a', 15b' and 15c' and the nodes 17a, 17b and 17c are added to the elements of FIG. 8A. In this case, the wiring take-out cell 14 of FIG. 8C serves in the same way as the wiring take-out cell 10 of FIG. 6A, since the terminals 7a, 7b and 7c can be connected to the wiring of the upper and lower sides wiring channel areas by the channel router.

Figure 9:
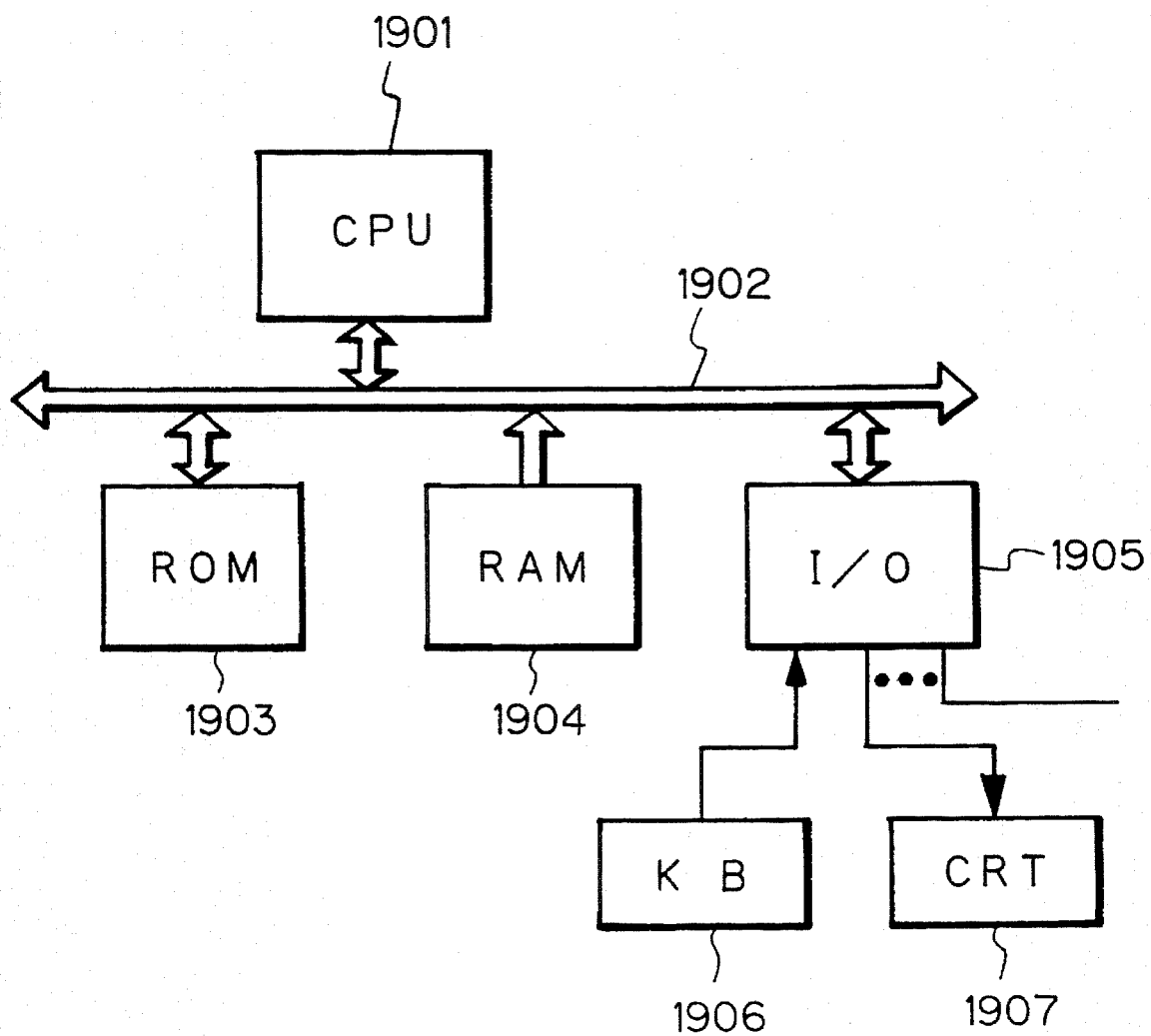
FIG. 9 is a block diagram illustrating a general automatic design system.

In FIG. 9, which illustrates a general automatic design system, reference numeral 1901 designates a central processing unit (CPU) which is connected via a bus 1902 to a read only memory (ROM) 1903 for storing programs, constants and the like, to a random access memory (RAM) for storing temporary data, and an input/output (I/O) interface 1905. Connected to the I/O interface 1905 are a keyboard 1906, a display unit 1907, and the like.

The operation of the automatic design system of FIG. 9 will now be explained with reference to FIG. 10.

At step 1001 logic cells are determined in accordance with logic information. Then, the logic cells are arranged in a plurality of logic cell areas arranged along the Y direction.

At step 1002, two adjacent logic cells, i.e., a left-side logic cell and a right-side logic cell are selected from the determined logic cells. Then, it is determined whether or not terminal information (or wiring information) at a right side edge of the left-side logic cell is the same *as terminal information at a left edge of the right-side logic cell the terminal information is divided into a plurality of edge types such as α, β, γ, ..., as explained above. If the two edge types are different from each other, the control proceeds to step 1003 which generates wiring take-out cells, which will be explained later. Otherwise, the control proceeds directly to step 1004.

At step 1004, it is determined whether or not the edge type determining step 1002 is performed upon all of the logic cells. Unless the edge type determining step 1002 is performed upon all of the logic cells, the control returns to step 1002 which performs an edge type determining operation upon two other adjacent logic cells.

At step 1005, each of the wiring take-out cells generated at step 1003 are arranged or inserted between the corresponding logic cells within the logic cell areas.

Then, at step 1006, wiring along the X-direction are arranged within a plurality of wiring channel areas adjacent to the logic cell areas in accordance with connection information of the logic cells. Note that the height of each wiring channel area is changed in accordance with the number of wiring arranged therein.

Next, at step 1007, wiring along the Y-direction are arranged between the logic cell areas including the wiring take-out cells. The arrangement of the Y-direction wiring can be carried out by the channel router.

Figure 10:
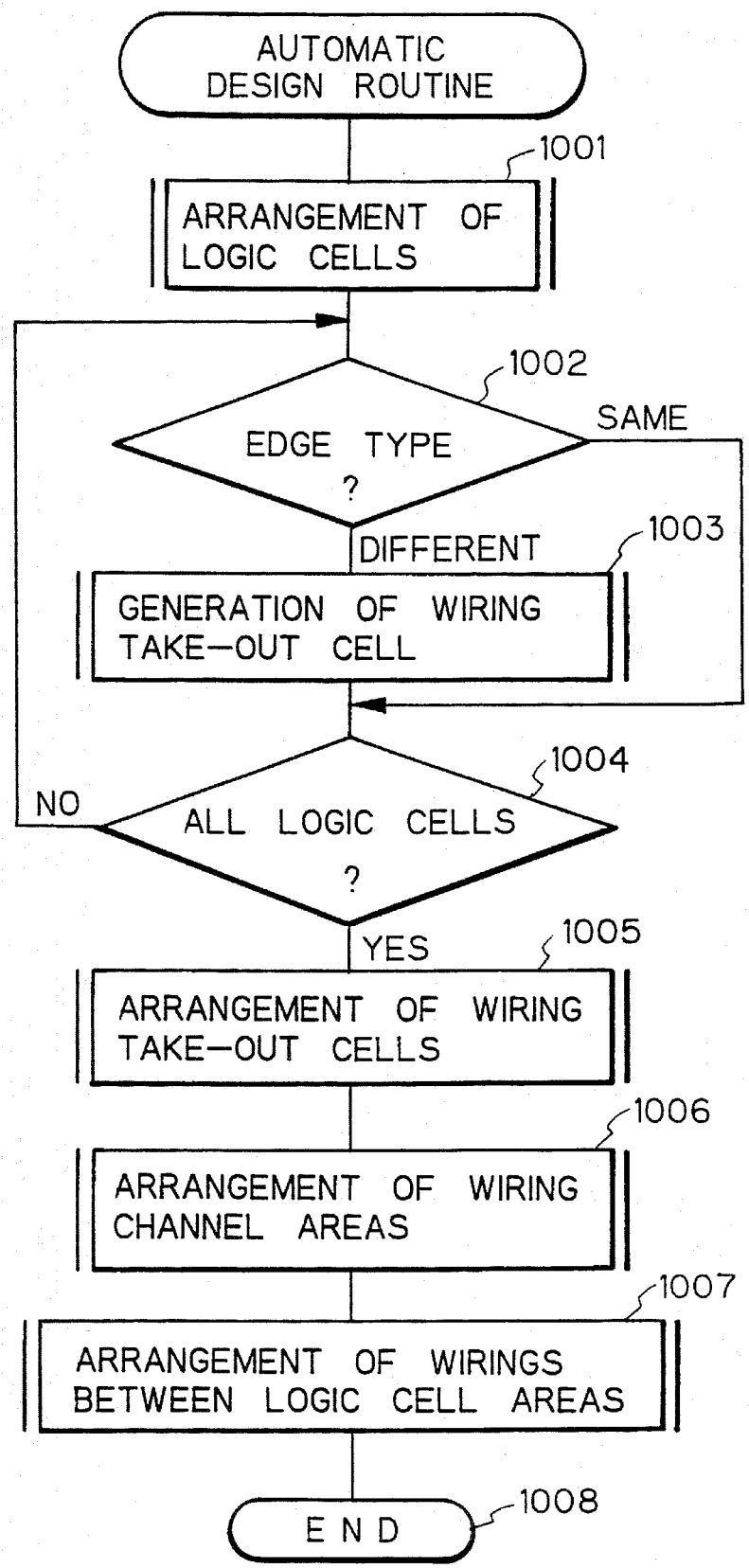
FIGS. 10 and 11 are flowcharts showing the operation of the automatic design system in accordance with the present invention.

Then, the routine of FIG. 10 is completed by step 1008.

Figure 11:
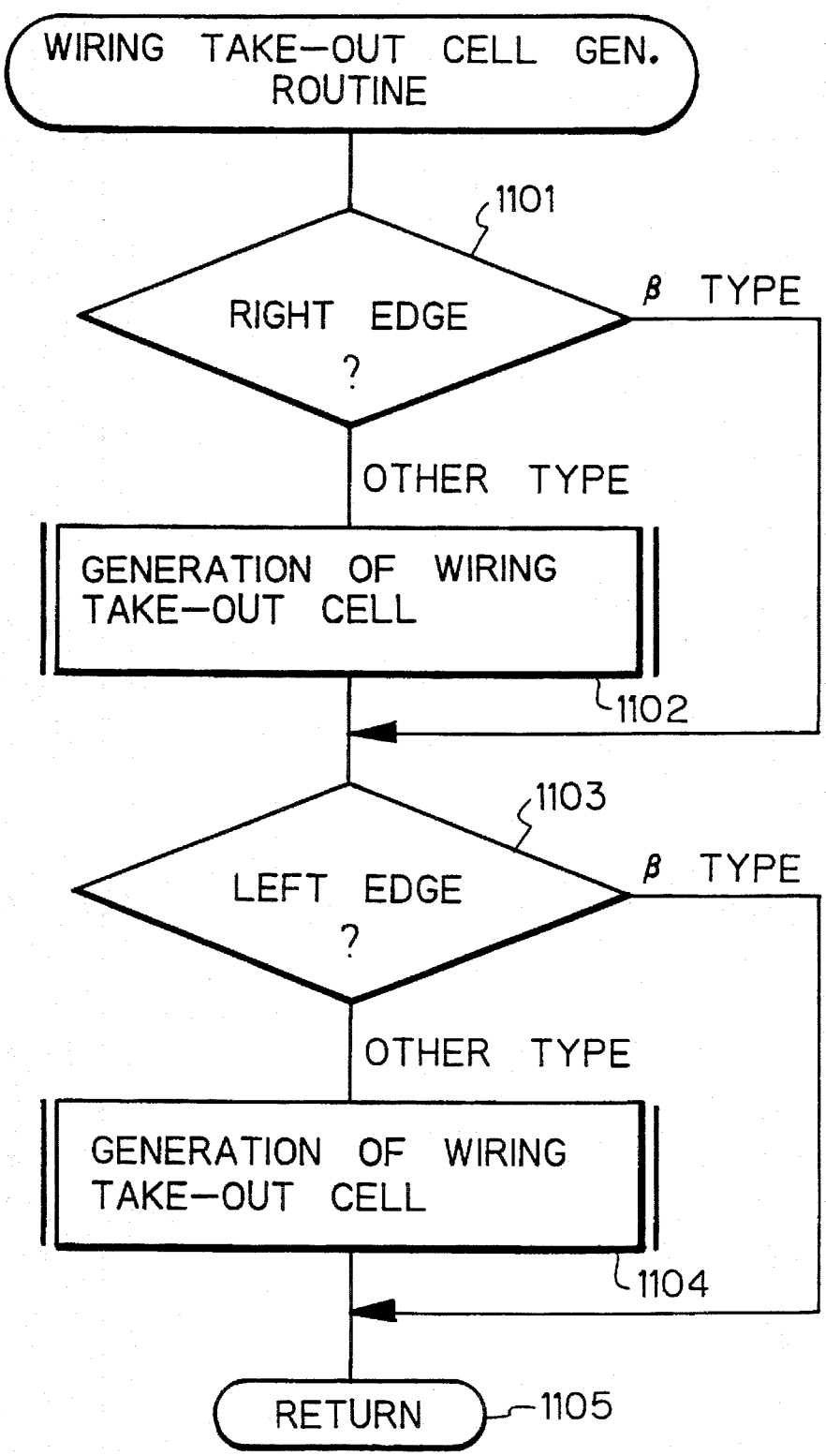

In FIG. 11, which is a detailed flowchart of step 1003 of FIG. 10, at step 1101, it is determined whether or not the terminal information at the right side edge of the left-side logic cell is β type such as the logic cell 202 of FIGS. 5 and 7. If β type, the control proceeds directly to step 1103. Otherwise, the control proceeds to step 1102.

At step 1102, a wiring take-out cell is generated. That is, terminal information such as 11a, 11b and 11c and wiring information such as 12a, 12b and 12c of FIG. 6A or 6B, or terminal information such as 15a, 15b and 15c (15a', 15b' and 15c'), wiring information such as 16a, 16b and 16c, and node information such as 17a, 17b and 17c of FIGS. 8A, 8B or 8C are calculated in accordance with the terminal information at the right side edge of the left-side logic cell. Similarly, at step 1103, it is determined whether or not the terminal information at the left side edge of the right-side logic cell is β type such as the logic cell 202 of FIGS. 5 and 7. If β type, the control proceeds directly to step 1105. Otherwise, the control proceeds to step 1104.

At step 1104, a wiring take-out cell is generated. That is, terminal information such as 11a, 11b and 11c and wiring information such as 12a, 12b and 12c of FIG. 6A or 6B, or terminal information such as 15a, 15b and 15c (15a', 15b' and 15c'), wiring information such as 16a, 16b and 16c, and node information such as 17a, 17b and 17c of FIGS. 8A, 8B or 8C are calculated in accordance with the terminal information at the left side edge of the right-side logic cell.

Then, at step 1105, the routine of FIG. 11 returns to step 1004 of FIG. 10.

Figure 12:
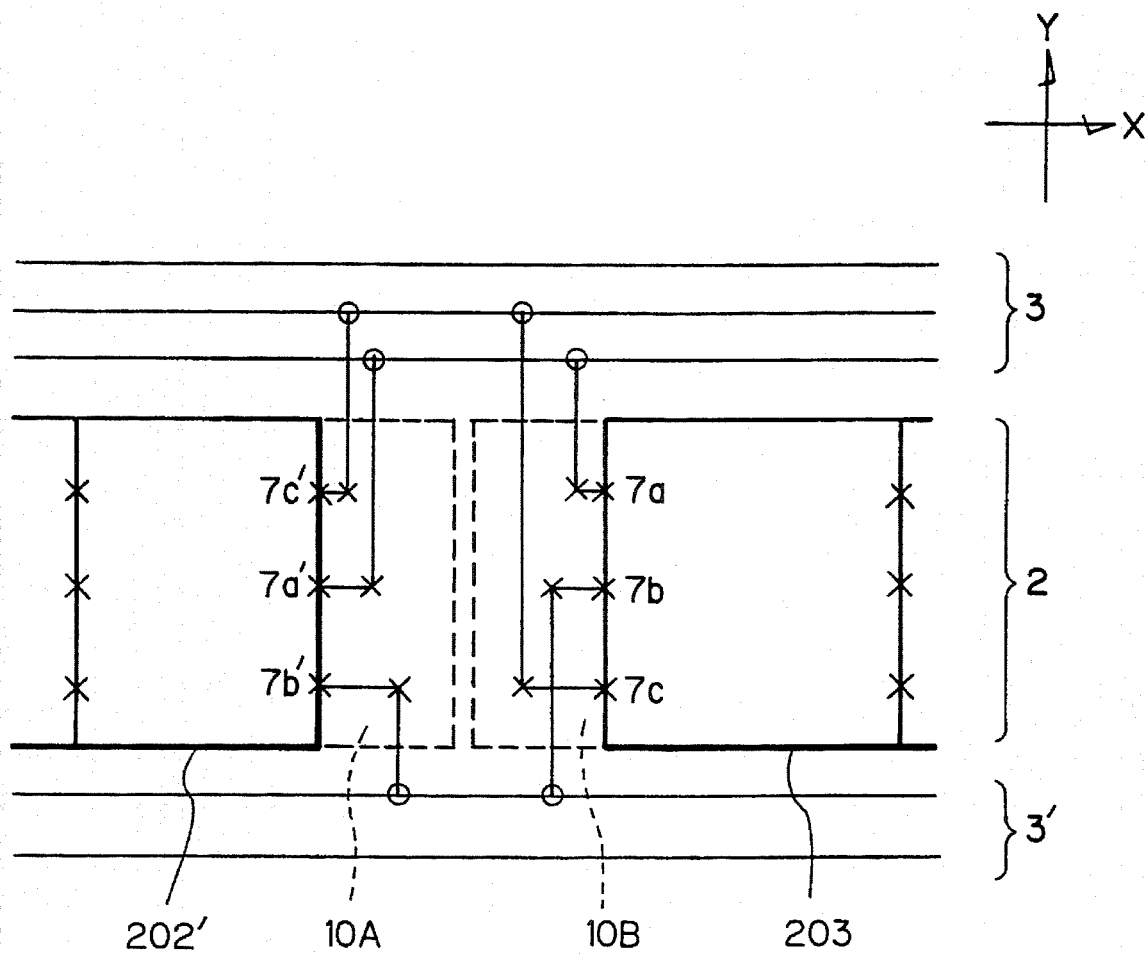
FIG. 12 is a layout diagram illustrating an example of the semiconductor device obtained by carrying out the operation as shown in FIGS. 10 and 11.

If the automatic design system using the routines of FIGS. 10 and 11 is applied to the device of FIG. 3, this device becomes a device as illustrated in FIG. 12. In FIG. 12, wiring take-out cells 10A and 10B, which are the same as the wiring take-out cell 10 of FIG. 6A, are generated. It is apparent that, in FIG. 12, all of the terminals 7a, 7b and 7c of the logic cell 203 are connected to the terminals 7a', 7b' and 7c' respectively, of the logic cell 202'.

In the above-mentioned embodiments, although standard cell-type devices are illustrated, the present invention can be also applied to a gate array type semiconductor device.

As explained hereinbefore, according to the present invention, since wiring take-out cells are generated and connected to specific logic cells which cannot be directly connected by the batting method, a wiring operation can be automatically performed upon such specific logic cells.

What is claimed is:

1. A semiconductor device comprising:
   a logic cell area including at least first and second logic cells which have different wiring arrangements from each other at opposing edges of said first and second logic cells;
   a wiring channel area adjacent to said logic cell area including first wiring; and
   a wiring take-out cell, located between said first anti second logic cells, said wiring take-out cell including second wiring only from at least one of said first and second logic cells to said first wiring.

2. A device as set forth in claim 1, wherein said wiring take-out cell further includes virtual terminals, each connected to one of said second wiring, said virtual terminals being within said wiring take-out cell.

3. A device as set forth in claim 1, wherein said wiring take-out cell further includes virtual terminals, each connected to one of said second wiring, said virtual terminals being at a boundary between said wiring take-out cell and said wiring channel area.

4. A device as set forth in claim 3, wherein said wiring take-out cell further includes nodes at intermediate points of said second wiring for bending said second wiring.

5. A semiconductor device comprising:
   a plurality of logic cell areas, each including logic cells arranged along a first direction, said logic cell areas being arranged along a second direction perpendicular to said first direction, at least adjacent first and second logic cells of said logic cells having different wiring arrangements from each other at opposing edges of said first and second logic cells;

a plurality of wiring channel areas arranged along said second direction, each being adjacent to at least one of said logic cell areas and including first wiring arranged along said first direction;

at least one wiring take-out cell arranged between said first and second logic cells, said wiring take-out cell including second wiring only from at least one of said first and second logic cells to said first wiring.

6. A device as set forth in claim 5, wherein said wiring take-out cell further includes virtual terminals, each connected to one of said second wiring, said virtual terminals being within said wiring take-out cell.

7. A device as set forth in claim 5, wherein said wiring take-out cell further includes virtual terminals, each connected to one of said second wiring, said virtual terminals being at a boundary between said wiring take-out cell and said wiring channel areas.

8. A device as set forth in claim 7, wherein said wiring take out cell further includes nodes at intermediate points of said second wiring for bending said second wiring.

* * * * *